Sept. 20, 1960 M. M. ATALLA 2,953,486

JUNCTION FORMATION BY THERMAL OXIDATION OF SEMICONDUCTIVE MATERIAL

Filed June 1, 1959 2 Sheets-Sheet 1

INVENTOR
M. M. ATALLA
BY H. W. Lockhart
ATTORNEY

Sept. 20, 1960 M. M. ATALLA 2,953,486
JUNCTION FORMATION BY THERMAL OXIDATION
OF SEMICONDUCTIVE MATERIAL
Filed June 1, 1959 2 Sheets-Sheet 2

INVENTOR
M. M. ATALLA
BY H. L. Lockhart
ATTORNEY

United States Patent Office 2,953,486

Patented Sept. 20, 1960

2,953,486

JUNCTION FORMATION BY THERMAL OXIDATION OF SEMICONDUCTIVE MATERIAL

Martin M. Atalla, Mountainside, N.J., assignor to Bell Telephone Laboratories, Incorporated, New York, N.Y., a corporation of New York Filed June 1, 1959, Ser. No. 817,239

10 Claims. (Cl. 148—1.5)

This invention relates to methods of providing P–N junctions in semiconductive crystals.

P–N junctions have been provided formerly by many methods well known in the art. One such method is termed the vapor solid diffusion method. This method comprises essentially of vaporizing a conductivity type determining impurity, termed significant impurity, and exposing a semi-conductive crystal of the opposite conductivity type to the vapor at an elevated temperature.

Another such method is termed the "out diffusion" method: if a semiconductive crystal includes two significant impurities of opposite conductivity types which have widely different evaporation rates from the crystal, a P–N junction may be formed by heating the crystal in a vacuum.

In the method of this invention a P–N junction is formed by heating, in an oxidizing atmosphere, a crystal which includes two significant impurities of opposite conductivity types having preselected ratios between both their concentrations and diffusion coefficients and having preselected distribution coefficients.

One object of this invention is a method of providing P–N junctions in semiconductive crystals by a surface oxidation treatment.

When the surface of a semiconductive crystal such as silicon or germanium is heated in an oxidizing atmosphere, such as water vapor or oxygen, the surface layer of atoms is converted to an oxide. As the process continues, the underlying atoms diffuse through this layer of oxide to the free surface and are in turn converted to oxide. This increases the thickness of the oxide with time parabolically according to the formula $X_0=\sqrt{Ct}$ where $X_0$ is the oxide thickness, $t$ is the time and C is the oxidation rate constant. The thickness of the semiconductive crystal correspondingly decreases. The effect may be thought of as a movement into the crystal of the interface between the crystal and its oxide. The interface will encounter impurities as it moves. These impurities will pass through the interface or be accumulated by it depending on the distribution coefficient of the impurity. The distribution coefficient is a measure of the relative affinity the impurity has for the oxide and is equal to the concentration of the impurity in the oxide divided by the concentration of the impurity in the crystal at a given temperature.

This invention is based on the discovery that the interface between a semiconductive crystal and its oxide can be made to accumulate two significant impurities to form P–N junctions.

If a semiconductive crystal contains two significant impurities of opposite conductivity types and these two impurities have zero or very low distribution coefficients, the interface will accumulate both impurities in front of it as it moves into the crystal to the extent that the diffusion coefficient permit such accumulation. Furthermore, if both significant impurities have high distribution coefficients and low diffusion coefficients in the oxide, the region of the oxide contiguous to the interface will become saturated and prevent impurities from passing into the oxide. Therefore, impurities likewise will accumulate at the interface in this latter case.

Once the significant impurities are accumulated at the crystal side of the interface, the distribution of each impurity through the crystal will depend on its respective diffusion coefficient. If the impurities are preselected such that the impurity with the higher concentration has the higher diffusion coefficient, a P–N junction can be formed on oxidation. This forms the basis of the method of the invention.

Therefore, a feature of this invention is the preselection of impurities such that the higher concentration impurity also has the higher diffusion coefficient.

Further objects and features will be disclosed in the course of the description which is rendered below with reference to the accompanying drawings in which.

Figure 1:
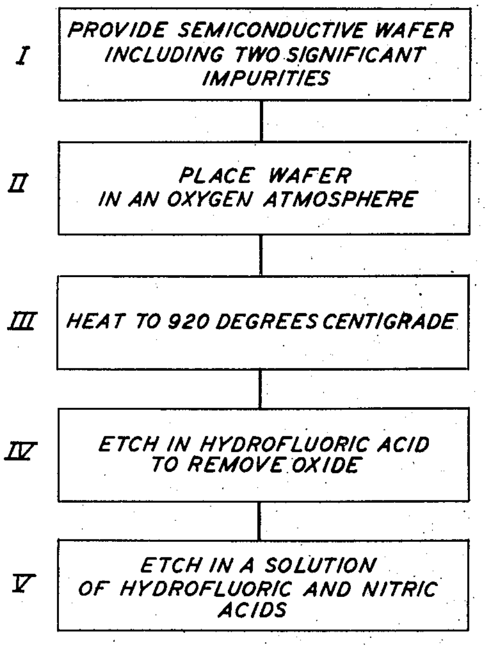
Fig. 1 is a block diagram illustrating the various steps of one embodiment of the method of this invention.

In Fig. 1, block I indicates providing a silicon semiconductive wafer including two significant impurities. It is important to choose a proper combination of two significant impurities of opposite conductivity types. One impurity must be provided in greater concentration than the other and the impurity with the greater concentration must have the greater diffusion rate in the semiconductive crystal. Furthermore, the impurities also must accumulate at the crystal side of the interface between the semiconductive crystal and its oxide. Therefore, the impurities must be chosen with suitable distribution coefficients. The pairs of impurities, antimony-gallium, and phosphorous-boron, have been found suitable as described below in relation to the specific embodiments. The wafer specified in block I is provided typically by including the desired impurities in a melt from which a semiconductive single crystal is grown.

This single crystal then is divided into slices by well-known techniques, and the slices then are divided into wafers by ultrasonic cutting.

The wafer, containing the selected pair of impurities, is then placed in an oxygen atmosphere and heated to approximately 920 degrees centigrade as indicated in blocks II to III to produce an oxide coating and accumulate the impurities. In regard to this step temperatures of from 900 to 1250 degrees centigrade have been found suitable. The length of time required to produce devices of currently useful characteristics at the various temperatures varies from several hours at 900 degrees centigrade to about 1 hour at 1200 to 1250 degrees centigrade.

The oxide coating is then removed by etching in a suitable solution such as a hydrofluoric acid solution as indicated in block IV. The wafer then is etched in a suitable solution such as one part hydrofluoric acid to six parts nitric acid by volume, to remove any undesirable surface conductivity regions.

This invention provides a method whereby strict control may be exercised over the characteristics of the device. Furthermore, these characteristics are reproducible. The method also provides greater versatility than prior methods both by allowing a greater selection of impurities and by ease of application to the fabrication of large area devices.

Figure 2:
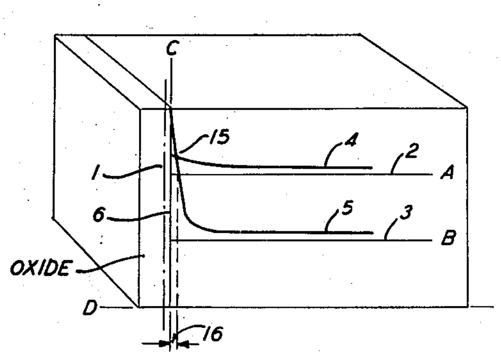
Figs. 2–6 are graphical representations of the formation of P–N junctions in accordance with the present invention.

The graph of Fig. 2 depicts the concentration of impurities in the body of the semiconductive crystal treated by the method of Fig. 1. The abscissa represents distance into the crystal and may be thought of as representing a face of the semiconductive crystal. The ordinate represents impurity concentration and also may be thought of as representing a second face of the semiconductive crystal. These faces are perpendicular both to each other and to the plane of the paper. Impurity A has a greater concentration in the body of the crystal than impurity B as is represented by the horizontal lines 2 and 3, respectively.

Only one surface of the crystal is oxidized. This surface is surface 1. When oxidation of surface 1 is initiated, the surface becomes the interface 6 between the crystal and the oxide. This interface, as described above moves into the crystal. The ordinate axis is chosen to coincide with the final position of this interface. Curve 4 shows a slight increase in impurity A concentration toward the interface 6. This indicates that as the interface 6 moves into the crystal the A impurities accumulate, but a high diffusion rate maintains a fairly uniform concentration throughout the crystal. Curve 5 shows a large increase in impurity B concentration toward the interface. This indicates a low diffusion rate because the B impurities do not maintain a uniform concentration.

The curves 4 and 5 intersect at point 15. This point represents the final position of the P–N junction. The distance 16 between this junction and the interface between the crystal and the oxide can be expressed as a function of the oxide thickness. This is very convenient because the color of the oxide also depends on the thickness of the oxide. Therefore, a color chart can be prepared from which the depth of the junction can be determined merely by comparing the particular oxide to the color chart.

The distribution coefficients of both impurities A and B, in this case have been assumed to equal zero. This is substantially true for some impurities such as phosphorus, antimony and arsenic. For impurities with low distribution coefficients, not quite zero, there is a similar result. In this latter case, however, there is an accumulation of impurities in the oxide.

Figure 3:
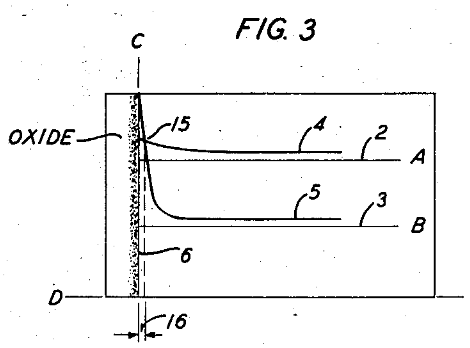

Fig. 3 is a graph similarly representing the impurity concentrations where impurities A and B have the same relative diffusion coefficients and concentrations as in Fig. 2. However, here both impurities have a high distribution coefficient. There will be an immediate depletion of both impurities from the surface regions, but the contiguous region of the oxide will become saturated quickly especially if the impurities have a low diffusion coefficient in the oxide. This saturation will prevent additional impurities from crossing the interface. The resulting P–N junction 15 is at a different depth which can be determined by comparison with a calibrated color chart.

Figure 4:
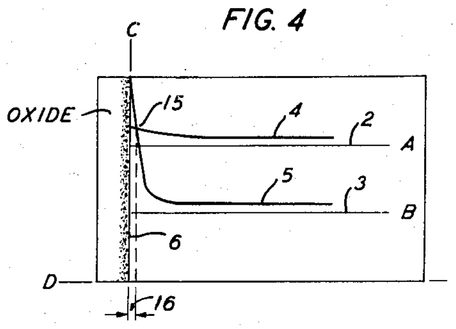

Fig. 4 depicts the result when the impurity with the higher concentration has a high diffusion coefficient, a high distribution coefficient and a low diffusion coefficient in the oxide. While the impurity with the lower concentration has a low diffusion coefficient and low distribution coefficient, the result is similar to that of Fig. 3.

Figure 5:
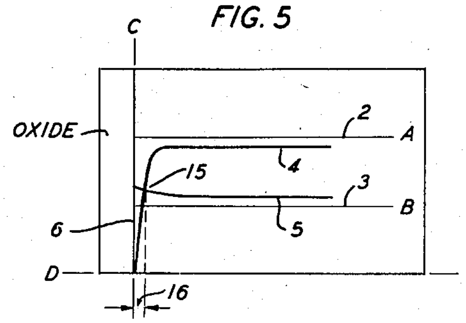

Fig. 5 depicts the result when the impurity with the higher concentration has the low diffusion coefficient, high distribution coefficient and high diffusion coefficient in the oxide while the impurity with the lower concentration has a high diffusion coefficient and a low distribution coefficient.

Figure 6:
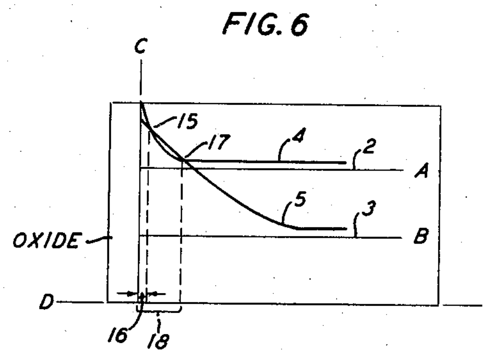

Fig. 6 is a graph depicting the formation of a P–N–P configuration in accordance with the present invention. Curves 4 and 5 may be seen to intersect at points 15 and 17 which are at a depth 16 and 18, respectively, from the interface. This indicates the formation of P–N junctions at these points. A P–N–P configuration may be provided with such impurity combinations as boron and phosphorus in concentration ratio of $$\frac{.75}{1}$$

Gallium and antimony in a concentration ratio of $$\frac{.6}{1}$$

may also be used.

Figure 7:
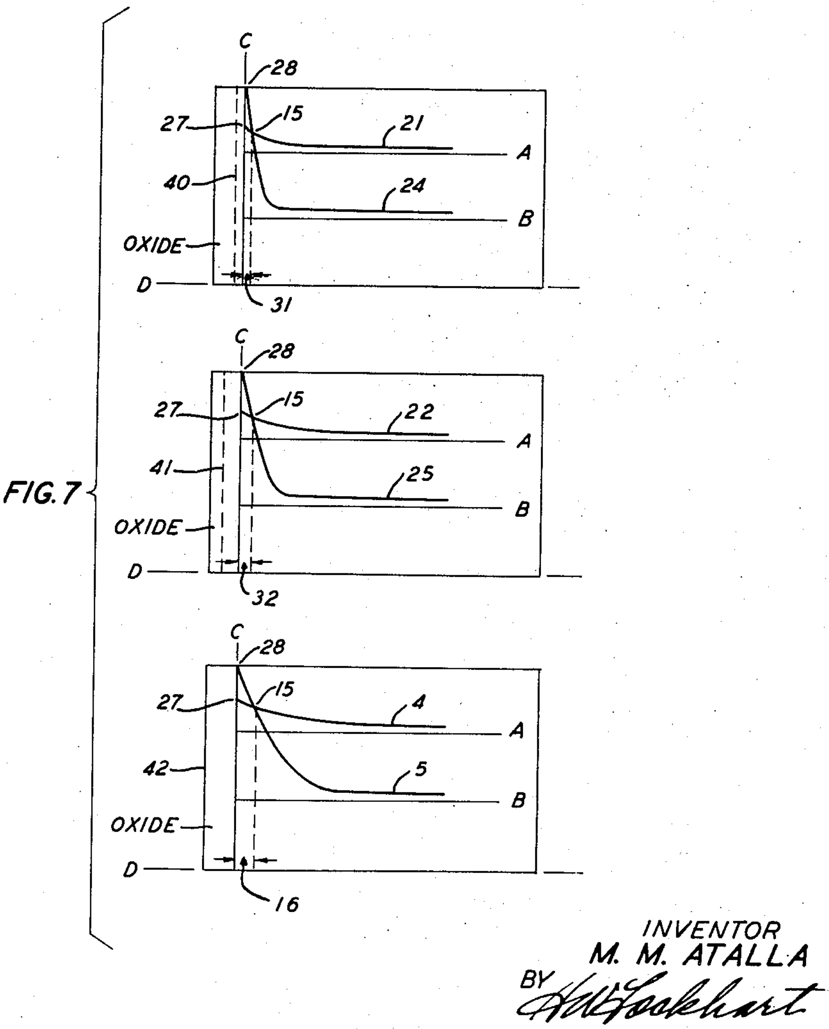
Fig. 7 is a series of graphs depicting the changes in impurity concentration of the crystal with time.

Fig. 7 is a series of graphs depicting the variation of the impurity concentration curves in time. Curves 21 and 24 represent the concentration of the A and B impurities, respectively, as oxidation begins. The concentration of the impurities A and B at the very surface of the crystal raises immediately to values denoted by points 27 and 28, respectively. These values are constant and are functions of temperature only. Curves 22 and 25 represent the impurity concentrations at some intermediate time and curves 4 and 5 represent the concentration when the oxidation is terminated. The point 15 may be seen to move into the crystal from an initial depth 31 to a depth 32 and finally to the depth 16 of Fig. 2. Dotted line 40 indicates the thickness of the oxide when the point 15 is at a depth 31. This thickness increases in time as indicated by dotted lines 41 and 42 correspondingly as the depth of point 15 increases to depth 32 and then to depth 16.

The only limits on the impurity concentrations is that one concentration be higher than the other and the ratio of the high to low concentrations be no greater than a critical ratio determined by the formula $$\frac{Z_a\left(1+\sqrt{1-\frac{1}{Z_a^2}}\right)}{Z_b\left(1+\sqrt{1-\frac{1}{Z_b^2}}\right)}>1.0$$

where $$Z=1+\frac{C}{4D}$$

and C is the oxidation rate constant and D is the diffusion constant. For gallium and antimony, this ratio should not exceed three at 920 degrees centigrade. Also the resistivity desired in the separate regions of the finished device is an important consideration. The only limits on the diffusion coefficient is that the impurity with the higher concentration have the higher diffusion coefficient in the particular crystal. The distribution coefficient may be described as high when it indicates that the impurity will be removed from the surface region faster than they accumulate by diffusion.

This will become clearer by reference to the numbers used in the following specific embodiment:

A semiconductive wafer was cut from a crystal which had been grown from a melt including 30 gms. of silicon, 94.8 mg. of gallium and 60.5 mg. of antimony. The antimony concentration is approximately $$10^{19}\ \frac{\text{atoms}}{\text{cc.}}$$

and the concentration of gallium is greater by approximately $$10^{17}\ \frac{\text{atoms}}{\text{cc.}}$$

than the antimony concentration. The crystal was, therefore, of P-type conductivity. At 1200 degrees centigrade the diffusion coefficient of antimony in silicon is about $1.6\times10^{-13}$ cm.$^2$/sec., the diffusion coefficient of gallium in silicon is about $3\times10^{-12}$ cm.$^2$/sec., the distribution coefficient of antimony is less than $10^{-2}$, and that of gallium is higher.

This crystal was heated to about 1200 degrees centigrade in a pure oxygen atmosphere. The concentration of antimony in the surface region was found to be higher than that of gallium after the surface treatment, both because the constant concentration of antimony at the crystal surface was higher than that of gallium and the accumulated gallium redistributed itself through the crystal more quickly than the antimony.

The antimony concentration drops quickly with distance into the crystal from the oxidized surface and at some point will drop below the gallium concentration. This will determine the depth of the P–N junction. In this specific case, the P–N junction was formed $0.05 \times 10^{-3}$ inches distance from the surface oxidized, the crystal having been heated for one hour at 1200 degrees centigrade.

No effort has been made to describe all possible embodiments of the invention. It should be understood that the embodiments described are merely illustrative of the preferred form of the invention and various modifications may be made therein without departing from the scope and spirit of this invention.

For example, it will be understood that although the process has been described in terms of a single wafer, the procedure may involve processing of an entire slice of semiconductive material as far as the removal of the oxide before the slice is divided into a number of individual wafers.

Also, it is contemplated that other types of oxidizing atmospheres such as air and ozone may be used.

For convenience, the invention has been described particularly for use with a semiconductive wafer which initially had uniform concentration of two significant impurities throughout the wafer. It can be appreciated that the principles are applicable even though the wafer may include, in some portion sufficiently remote not to affect the practice of the invention, a separate rectifying junction or some other concentration of impurities. Therefore, the process can be used even though the wafer already includes P–N junctions formed by some other method.

Additionally, it is unnecessary that the concentrations of significant impurities at the surface region of interest be uniform for the practice of the invention.

Furthermore, while the invention has been disclosed with particular reference to the use of a moving oxide interface for accumulating the significant impurities whereby a P–N junction is formed, it should be evident that other compounds of the semiconductor material can similarly be employed with analogous results.

What is claimed is:

1. A method of forming at least one rectifying junction in a semiconductive crystal selected from the group consisting of germanium and silicon comprising the steps of growing a semiconductor crystal from a melt including a first conductivity determining impurity characteristic of one conductivity type and a second conductivity determining impurity characteristic of the opposite conductivity type, said first impurity having a preselected concentration and diffusion coefficient, said second impurity having a relatively higher concentration and a relatively higher diffusion coefficient, the ratio of the concentration of said second impurity to that of said first impurity being no greater than $$\frac{Z_a\left(1+\sqrt{1-\frac{1}{Z_a^2}}\right)}{Z_b\left(1+\sqrt{1-\frac{1}{Z_b^2}}\right)}>1.0$$

where $$Z=1+\frac{C}{4D}$$

C is the oxidation rate constant, D is the diffusion constant and subscripts $a$ and $b$ denote the impurity with the higher and lower concentration, respectively, heating in an oxygen atmosphere to convert successive surface layers to an oxide of the semiconductive material having little affinity for either of said impurities for accumulating at the interface between said oxide and the semiconductive material conductivity type determining impurities originally in the converted region to form a P–N junction.

2. A method of forming a rectifying junction in a semiconductive body selected from the group consisting of germanium and silicon, comprising the steps of growing a single semiconductive crystal from a melt including a first significant impurity characteristic of one conductivity type and a second significant impurity characteristic of the opposite conductivity type, said first impurity having a preselected concentration, diffusion coefficient and distribution coefficient, said second impurity having a relatively higher concentration, relatively higher diffusion coefficient, and relatively higher distribution coefficient, the ratio of the concentration of said second impurity to that of said first impurity being no greater than $$\frac{Z_a\left(1+\sqrt{1-\frac{1}{Z_a^2}}\right)}{Z_b\left(1+\sqrt{1-\frac{1}{Z_b^2}}\right)}>1.0$$

where $$Z=1+\frac{C}{4D}$$

C is the oxidation rate constant, D is the diffusion constant and the subscripts $a$ and $b$ refer to the impurity with the higher and lower concentration respectively, and heating at least one surface of said body in an oxidizing atmosphere for a time and at a temperature such that a rectifying junction is formed adjacent said surface and an oxide layer is formed on said surface.

3. A method in accordance with claim 2 wherein said first significant impurity is antimony and said second significant impurity is gallium.

4. A method in accordance with claim 2 wherein said first significant impurity is phosphorus and said second significant impurity is boron.

5. A method in accordance with claim 2 wherein said oxidizing atmosphere comprises oxygen.

6. A method in accordance with claim 2 wherein said oxidizing atmosphere comprises water vapor.

7. A method in accordance with claim 2 wherein said semiconductive body is germanium.

8. A method in accordance with claim 2 wherein said semiconductive body is silicon.

9. A method of forming a rectifying junction in a semiconductive body selected from the group consisting of germanium and silicon comprising the steps of growing a semiconductive body from a melt including a first significant impurity characteristic of one conductivity type and a second significant impurity characteristic of the opposite conductivity type, said first impurity having a preselected concentration, diffusion coefficient and zero distribution coefficient, said second impurity having a relatively higher concentration, higher diffusion coefficient and zero distribution coefficient, the concentration of said second impurity to that of said first impurity being no greater than $$\frac{Z_a\left(1+\sqrt{1-\frac{1}{Z_a^2}}\right)}{Z_b\left(1+\sqrt{1-\frac{1}{Z_b^2}}\right)}>1.0$$

where $$Z=1+\frac{C}{4D}$$

C is the oxidation rate constant, D is the diffusion constant and the subscripts $a$ and $b$ refer to the impurity with the higher and lower concentration, respectively, and, heating at least one surface of said body in an oxidizing atmosphere for a time and at a temperature such that a rectifying junction is formed adjacent said surface.

10. A method of forming a rectifying junction in a silicon body comprising the steps of growing a single crystal from a melt including the two impurities gallium and antimony, the ratio of the concentration of gallium to that of antimony being neither greater than a factor of 3 nor less than 1, and heating at least one surface of said body in an oxidizing atmosphere at approximately 920 degrees centigrade.

References Cited in the file of this patent

UNITED STATES PATENTS

| | | |
|---|---|---|
| 2,879,190 | Logan et al. | Mar. 24, 1959 |
| 2,894,184 | Veach et al. | July 7, 1959 |
| 2,899,344 | Atalla et al. | Aug. 11, 1959 |